US012584985B1

(12) United States Patent
Jeong

(10) Patent No.: US 12,584,985 B1
(45) Date of Patent: Mar. 24, 2026

(54) APPARATUS FOR OBTAINING MAGNETIC RESONANCE IMAGES BASE ON DEEP LEARNING MODEL AND METHOD OF CONTROLLING THE SAME

(71) Applicant: AIRS MEDICAL INC., Seoul (KR)

(72) Inventor: Geunu Jeong, Seoul (KR)

(73) Assignee: AIRS MEDICAL INC., Seoul (KR)

( * ) Notice: Subject to any disclaimer, the term of this patent is extended or adjusted under 35 U.S.C. 154(b) by 0 days.

(21) Appl. No.: 19/180,138

(22) Filed: Apr. 16, 2025

Related U.S. Application Data

(63) Continuation of application No. PCT/KR2025/000746, filed on Jan. 13, 2025.

(30) Foreign Application Priority Data

Oct. 28, 2024 (KR) ........................ 10-2024-0148191

(51) Int. Cl.
*G06T 5/70* (2024.01)
*G01R 33/56* (2006.01)

(52) U.S. Cl.
CPC ............ *G01R 33/5608* (2013.01); *G06T 5/70* (2024.01); *G06T 2207/20081* (2013.01); *G06T 2207/20084* (2013.01); *G06T 2207/20182* (2013.01)

(58) Field of Classification Search
CPC .................. G01R 33/5608; G06T 5/70; G06T 2207/20081; G06T 2207/20084; G06T 2207/20182
See application file for complete search history.

(56) References Cited

U.S. PATENT DOCUMENTS

2019/0156524 A1* 5/2019 Park .......................... G06T 5/60
2019/0244399 A1* 8/2019 Li .................... G01R 33/56509
(Continued)

FOREIGN PATENT DOCUMENTS

KR 10-2393761 B1 5/2022
KR 10-2475397 B1 12/2022
(Continued)

OTHER PUBLICATIONS

Office Action for Korean Patent Application No. 10-2024-0148191 issued by the Korean Patent Office on Mar. 5, 2025.

*Primary Examiner* — Van D Huynh
(74) *Attorney, Agent, or Firm* — IP & T GROUP LLP

(57) ABSTRACT

The present disclosure provides an apparatus for restoring the quality of magnetic resonance images based on a deep learning model and a method of controlling the same. The method includes: obtaining a training image corresponding to each magnetic resonance image by applying at least one of a plurality of elements set in connection with the quality of the magnetic resonance image to a magnetic resonance signal corresponding to the magnetic resonance image; obtaining a training dataset including the magnetic resonance image as label data and the obtained training image as input data matching the label data; and training a neural network model based on the training dataset and context data corresponding to the training image. Obtaining the training image includes distorting the magnetic resonance signal by applying the at least one of the plurality of elements and obtaining the training image based on the distorted magnetic resonance signal.

13 Claims, 9 Drawing Sheets

(56) References Cited

U.S. PATENT DOCUMENTS

| | | | | |
|---|---|---|---|---|
| 2020/0341103 A1* | 10/2020 | Akcakaya | .............. | G06N 3/084 |
| 2021/0217213 A1* | 7/2021 | Cole | .................... | G06N 3/0895 |
| 2022/0036512 A1* | 2/2022 | Kim | ................... | G01R 33/5608 |
| 2022/0261965 A1* | 8/2022 | Ji | ............................. | G06N 3/09 |
| 2023/0341490 A1* | 10/2023 | Wang | ................. | G01R 33/5612 |
| 2024/0127498 A1* | 4/2024 | Kim | ........................ | G06N 3/044 |
| 2024/0296527 A1* | 9/2024 | Nett | .......................... | G06T 7/11 |
| 2025/0061546 A1* | 2/2025 | Jeong | .................... | G16H 50/70 |
| 2025/0086942 A1* | 3/2025 | Kim | ........................ | G06N 3/045 |
| 2025/0131614 A1* | 4/2025 | Wang | ................... | G06T 11/003 |

FOREIGN PATENT DOCUMENTS

| | | | |
|---|---|---|---|
| KR | 10-2546620 B1 | 6/2023 |
| KR | 10-2590926 B1 | 10/2023 |

* cited by examiner

APPARATUS FOR OBTAINING MAGNETIC RESONANCE IMAGES BASE ON DEEP LEARNING MODEL AND METHOD OF CONTROLLING THE SAME

CROSS-REFERENCE TO RELATED APPLICATION(S)

This application is a bypass continuation of International Application No. PCT/KR2025/000746, filed on Jan. 13, 2025, which is based on and claims priority to Korean Patent Application No. 10-2024-0148191, filed on Oct. 28, 2024, in the Korean Intellectual Property Office, the disclosures of which are incorporated by reference herein in their entireties.

TECHNICAL FIELD

The present disclosure relates to deep learning technology in the medical field, and more particularly, to an apparatus for restoring the quality of magnetic resonance images based on a deep learning model and a method of controlling the same.

BACKGROUND ART

In order to observe and diagnose the inside of a patients body, X-ray imaging devices, ultrasound diagnostic devices, computed tomography devices, magnetic resonance imaging (MRI) devices, and the like are being utilized as means for obtaining information about the patients internal body. Among them, magnetic resonance imaging is attracting attention for its usefulness compared to other imaging technologies in that it can take images without exposing a patient to radiation or administering a contrast agent, and in particular, it provides high resolution and excellent soft tissue contrast.

In the case of magnetic resonance imaging technology, it has a problem in that it takes a long time to obtain a magnetic resonance image. Accordingly, research into accelerated imaging technology has been actively conducted in the relevant technical field as a way to shorten the imaging time taken to obtain a magnetic resonance image. However, magnetic resonance images obtained via accelerated imaging technology have a problem in that their resolution is low or they contain noise, making accurate analysis difficult. In particular, there are cases where information about a patient's internal body is omitted in magnetic resonance images.

As a result, solving the two problems of achieving the acceleration of magnetic resonance imaging and obtaining high-quality magnetic resonance images at the same time has been a long-standing issue in the relevant technical field. Furthermore, artificial intelligence technology has been proposed as a solution to this issue. More specifically, a method of restoring the quality of magnetic resonance images obtained through accelerated imaging technology using an artificial intelligence model corresponds to the solution.

To this end, it is necessary to effectively train an artificial intelligence model. In particular, it is necessary to secure a training dataset composed of not only high-quality input data but also corresponding high-quality label data. However, conventional input data includes only cases of uniform under-sampling (or random under-sampling) performed during an accelerated imaging process, which leads to limitations in the performance of an artificial intelligence model. In other words, resolution degradation and noise in magnetic resonance images during the accelerated imaging process may occur for various reasons. However, an appropriate method of generating a training dataset has not been proposed.

DISCLOSURE

Technical Problem

The present disclosure is conceived in response to the above-described background technology, and an object of the present disclosure is to provide an apparatus for obtaining magnetic resonance images based on a deep learning model and a method of controlling the same.

However, the objects to be achieved in the present disclosure are not limited to the object mentioned above, and other objects not mentioned may be clearly understood based on the following description.

Technical Solution

According to one embodiment of the present disclosure for achieving the above-described object, there is disclosed a method of obtaining magnetic resonance images based on deep learning, the method being performed by a computing device including at least one processor, the method including: obtaining a training image corresponding to each magnetic resonance image by applying at least one of a plurality of elements set in connection with the quality of the magnetic resonance image to a magnetic resonance signal corresponding to the magnetic resonance image; obtaining a training dataset including the magnetic resonance image as label data and the obtained training image as input data matching the label data; and training a neural network model based on the training dataset and context data corresponding to the training image; wherein obtaining the training image includes distorting the magnetic resonance signal by applying the at least one of the plurality of elements and obtaining the training image based on the distorted magnetic resonance signal.

Alternatively, obtaining the training image may include repeatedly distorting the magnetic resonance signal by varying at least one of the types and numbers of applied elements and obtaining a plurality of training images based on a plurality of differently distorted magnetic resonance signals, and the plurality of training images may have different qualities corresponding to the at least one of the types and numbers of applied elements.

Alternatively, the plurality of elements may include at least two of addition of Gaussian noise, uniform pattern under-sampling, random pattern under-sampling, Kmax under-sampling, elliptical under-sampling, and partial Fourier under-sampling.

Alternatively, the method may further include, when the number of the plurality of training images is smaller than a preset value, additionally distorting the magnetic resonance signal by adjusting the maximum frequency range of the Kmax under-sampling and additionally obtaining one or more training images based on the additionally distorted magnetic resonance signal.

Alternatively, the method may further include, when the number of the plurality of training images is smaller than a preset value, additionally distorting the magnetic resonance signal by adjusting the sampling multiple of at least one of the uniform pattern under-sampling, the random pattern under-sampling, the Kmax under-sampling, the elliptical under-sampling, and the partial Fourier under-sampling, and additionally obtaining one or more training images based on the additionally distorted magnetic resonance signal.

Alternatively, the method may further include, when the number of the plurality of training images is smaller than a preset value, adjusting the intensity of the Gaussian noise, additionally distorting the magnetic resonance signal by adding the adjusted Gaussian noise, and additionally obtaining one or more training images based on the additionally distorted magnetic resonance signal.

Alternatively, the neural network model may include a dynamic modulation pathway that is connected to an intermediate one of a plurality of layers constituting the neural network model and extracts feature information of the context data when the context data is input.

Alternatively, the method may further include identifying a scan parameter corresponding to the distorted magnetic resonance signal and identifying the identified scan parameter as the context data corresponding to the training image.

Alternatively, the method may further include identifying then amount of variation of noise by comparing the noise of the magnetic resonance signal and the noise of the distorted magnetic resonance signal with each other and identifying the identified amount of variation of noise as the context data corresponding to the training image.

Alternatively, obtaining the training dataset may include: when the magnetic resonance image is three-dimensional data, setting a first one of a plurality of image slices, included in the training image, as first input data; setting at least one slice adjacent to the first slice, out of the plurality of image slices included in the training image, as a second input data; setting a third slice corresponding to the first slice, out of a plurality of image slices included in the magnetic resonance image, as label data; and setting the first input data, the second input data, and the label data as the training dataset.

Alternatively, the method may further include performing standardization including at least one of the sizes, directions, pixel spacing, and scale adjustment of pixel values of the magnetic resonance image and the training image for the training dataset.

Alternatively, the method may further include setting a plurality of restoration scenarios for the magnetic resonance image according to at least one of the types and numbers of elements applied to the magnetic resonance signal, classifying the plurality of training images for the individual plurality of set scenarios, and obtaining a sub-training dataset corresponding to each of the scenarios.

According to one embodiment of the present disclosure for achieving the above-described object, there is disclosed a method of obtaining magnetic resonance images based on deep learning, the method being performed by a computing device including at least one processor, the method including: obtaining a magnetic resonance image based on an accelerated imaging method; and restoring the quality of the obtained magnetic resonance image by inputting the obtained magnetic resonance image and context data corresponding to the obtained magnetic resonance image to a pre-trained neural network model; wherein the magnetic resonance image is obtained based on a magnetic resonance signal, to which at least one of a plurality of elements connected with the quality of the magnetic resonance image is applied or noise is added, according to the accelerated imaging method.

Alternatively, the plurality of elements may include at least one of uniform pattern under-sampling, random pattern under-sampling, Kmax under-sampling, elliptical under-sampling, and partial Fourier under-sampling.

Alternatively, the neural network model may include a dynamic modulation pathway that is connected to an intermediate one of a plurality of layers constituting the neural network model and extracts feature information of the context data when the context data is input.

Alternatively, the method may further include: identifying a scan parameter corresponding to the magnetic resonance signal, and identifying the identified scan parameter as the context data; and inputting the identified context data to the dynamic modulation pathway.

According to one embodiment of the present disclosure for achieving the above-described object, there is disclosed a computing device for obtaining magnetic resonance images based on deep learning, the computing device including: memory configured to store a neural network model; and at least one processor configured to obtain a training image corresponding to each magnetic resonance image by applying at least one of a plurality of elements set in connection with the quality of the magnetic resonance image to a magnetic resonance signal corresponding to the magnetic resonance image, to obtain a training dataset including the magnetic resonance image as label data and the obtained training image as input data matching the label data, and to train the neural network model based on the training dataset and context data corresponding to the training image; wherein the at least one processor is further configured to distort the magnetic resonance signal by applying the at least one of the plurality of elements and obtain the training image based on the distorted magnetic resonance signal.

Advantageous Effects

According to the method of obtaining magnetic resonance images based on a deep learning model according to one embodiment of the present disclosure, training data including various resolution degradation and noise occurrence cases occurring in various accelerated imaging processes is secured and a neural network model is trained based on the data, so that the performance of the neural network model can be improved, thereby more effectively restoring the quality of low-quality magnetic resonance images obtained through accelerated imaging.

MODE FOR INVENTION

Figure 1:
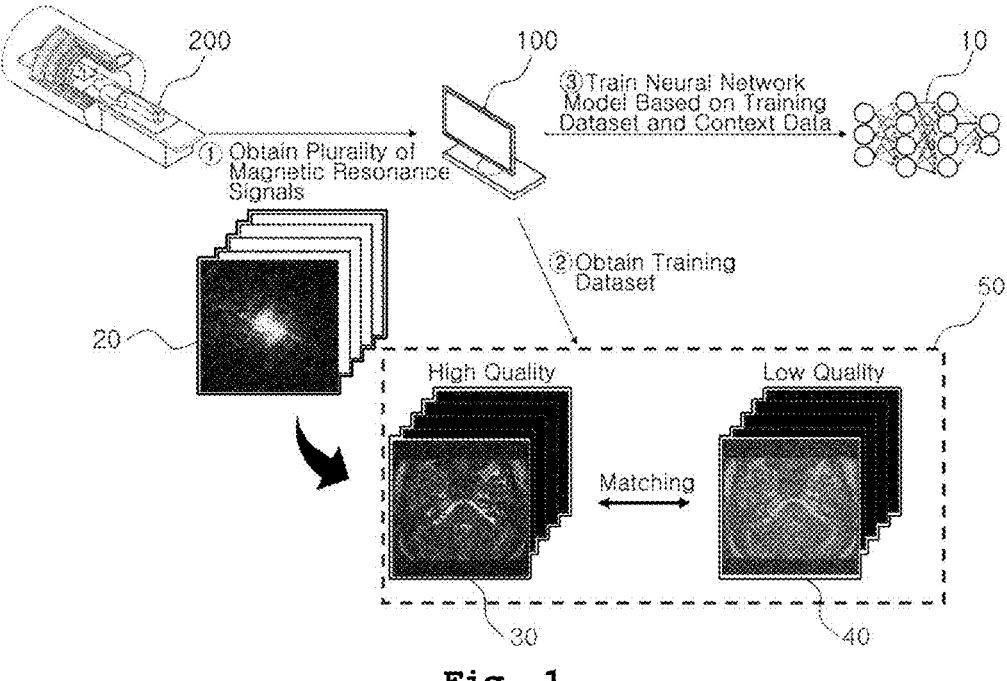
FIG. 1 is an exemplary diagram of a computing device for obtaining magnetic resonance images based on a deep learning model according to one embodiment of the present disclosure.

Embodiments of the present disclosure will be described in detail below with reference to the accompanying drawings so that those having ordinary skill in the art of the present disclosure (hereinafter referred to as those skilled in the art) can easily implement the present disclosure. The embodiments presented in the present disclosure are provided to enable those skilled in the art to use or practice the content of the present disclosure. Accordingly, various modifications to embodiments of the present disclosure will be apparent to those skilled in the art. That is, the present disclosure may be implemented in various different forms and is not limited to the following embodiments.

The same or similar reference numerals denote the same or similar components throughout the specification of the present disclosure. Additionally, in order to clearly describe the present disclosure, reference numerals for parts that are not related to the description of the present disclosure may be omitted in the drawings.

The term "or" used herein is intended not to mean an exclusive "or" but to mean an inclusive "or." That is, unless otherwise specified herein or the meaning is not clear from the context, the clause "X uses A or B" should be understood to mean one of the natural inclusive substitutions. For example, unless otherwise specified herein or the meaning is not clear from the context, the clause "X uses A or B" may be interpreted as any one of a case where X uses A, a case where X uses B, and a case where X uses both A and B.

The term "and/or" used herein should be understood to refer to and include all possible combinations of one or more of listed related concepts.

The terms "include" and/or "including" used herein should be understood to mean that specific features and/or components are present. However, the terms "include" and/or "including" should be understood as not excluding the presence or addition of one or more other features, one or more other components, and/or combinations thereof.

Unless otherwise specified herein or unless the context clearly indicates a singular form, the singular form should generally be construed to include "one or more."

The term "N-th (N is a natural number)" used herein can be understood as an expression used to distinguish the components of the present disclosure according to a predetermined criterion such as a functional perspective, a structural perspective, or the convenience of description. For example, in the present disclosure, components performing different functional roles may be distinguished as a first component or a second component. However, components that are substantially the same within the technical spirit of the present disclosure but should be distinguished for the convenience of description may also be distinguished as a first component or a second component.

The term "obtaining" used herein may be understood to mean not only receiving data over a wired/wireless communication network connecting with an external device or a system but also generating data in an on-device form.

Meanwhile, the term "module" or "unit" used herein may be understood as a term referring to an independent functional unit processing computing resources, such as a computer-related entity, firmware, software or part thereof, hardware or part thereof, or a combination of software and hardware. In this case, the "module" or "unit" may be a unit composed of a single component, or may be a unit expressed as a combination or set of multiple components. For example, in the narrow sense, the term "module" or "unit" may refer to a hardware component or set of components of a computing device, an application program performing a specific function of software, a procedure implemented through the execution of software, a set of instructions for the execution of a program, or the like. Additionally, in the broad sense, the term "module" or "unit" may refer to a computing device itself constituting part of a system, an application running on the computing device, or the like. However, the above-described concepts are only examples, and the concept of "module" or "unit" may be defined in various manners within the range understandable to those skilled in the art based on the content of the present disclosure.

The term "model" used herein may be understood as a system implemented using mathematical concepts and language to solve a specific problem, a set of software units intended to solve a specific problem, or an abstract model for a process intended to solve a specific problem. For example, a neural network "model" may refer to an overall system implemented as a neural network that is provided with problem-solving capabilities through training. In this case, the neural network may be provided with problem-solving capabilities by optimizing parameters connecting nodes or neurons through training. The neural network "model" may include a single neural network, or a neural network set in which multiple neural networks are combined together.

"Data" used herein may include an image, a signal, etc. The term "image" used herein may refer to multidimensional data composed of discrete image elements. In other words, "image" may be understood as a term referring to a digital representation of an object that can be seen by the human eye. For example, "image" may refer to multidimensional data composed of elements corresponding to pixels in a two-dimensional image. "Image" may refer to multidimensional data composed of elements corresponding to voxels in a three-dimensional image.

The term "image" used herein may refer to multi-dimensional data including discrete image elements (e.g., pixels in a two-dimensional image and voxels in a three-dimensional image). For example, the image may include, but is not limited to, a medical image obtained by a medical imaging device such as a magnetic resonance imaging device, a computed tomography (CT) device, an ultrasonic imaging device, an X-ray device, or the like.

The term "medical image" used herein is a concept that collectively refers to all forms of images encompassing medical knowledge, and may include images obtained through various modalities such as a visible light camera, an IR camera, or ultrasonic waves, X rays, CT, MRI, and PET.

The term "medical image archiving and communication system (PACS)" used herein refers to a system that stores, processes, and transmits medical images in accordance with the Digital Imaging and Communications in Medicine (DICOM) standard. For example, the "PACS" operates in conjunction with digital medical imaging equipment, and stores medical images such as magnetic resonance imaging (MRI) images and computed tomography (CT) images in accordance with the DICOM standard. The "PACS" may transmit medical images to terminals inside and outside a hospital over a communication network. In this case, meta information such as reading results and medical records may be added to the medical images.

The term "object" used herein refers to a subject to be imaged, and may include a person, an animal, or part thereof. For example, the object may include a part (an organ) of the body, a phantom, or the like. The phantom refers to a material having a volume considerably close to the density and effective atomic number of a living organism, and may include a spherical phantom having properties similar to those of the body.

A magnetic resonance image (MRI) system is a system that obtains an image of a tomographic part of an object by representing the intensity of a magnetic resonance (MR) signal for a radio frequency (RF) signal generated in a magnetic field having a specific intensity as a contrast.

The MRI system causes a main magnet to form a static magnetic field, and aligns the direction of the magnetic dipole moment of a specific atomic nucleus of an object located in the static magnetic field with the direction of the static magnetic field. A gradient magnetic field coil may induce a different resonance frequency for each part of an object by applying a gradient signal to a static magnetic field and thus forming a gradient magnetic field. An RF coil may radiate a magnetic resonance signal according to the resonance frequency of the part whose image is desired to be obtained. Furthermore, the RF coil may receive magnetic resonance signals having different resonance frequencies radiated from various parts of the object as the gradient magnetic field is formed. The MRI system obtains images by applying an image restoration technique to the magnetic resonance signals received via these steps. Furthermore, the MRI system may reconstruct the plurality of magnetic resonance signals into image data by performing serial or parallel signal processing on the plurality of magnetic resonance signals received by the multi-channel RF coil.

The foregoing descriptions of the terms are intended to help to understand the present disclosure. Accordingly, it should be noted that unless the above-described terms are explicitly described as limiting the content of the present disclosure, the terms in the content of the present disclosure are not used in the sense of limiting the technical spirit of the present disclosure.

FIG. 1 is an exemplary diagram of a computing device 100 for obtaining magnetic resonance images based on a deep learning model according to one embodiment of the present disclosure.

The computing device 100 for obtaining magnetic resonance images based on a deep learning model according to the embodiment of the present disclosure may be a hardware device or part of a hardware device that performs comprehensive processing and calculation of data, or may be a software-based computing environment that is connected to a communication network. For example, the computing device 100 may be a server that performs an intensive data processing function and shares resources, or may be a client that shares resources through interaction with a server. Furthermore, the computing device 100 may be a cloud system that enables a plurality of servers and clients to interact with each other and comprehensively process data. Since the above descriptions are only examples related to the type of computing device 100, the type of computing device 100 may be configured in various manners within a range understandable to those skilled in the art based on the content of the present disclosure. As an example, the computing device 100 may include a smartphone, a tablet PC, a PC, a smart TV, a micro-server, a cloud server, and the like that process magnetic resonance images or perform a processing function. As another example, the computing device 100 may be a magnetic resonance imaging (MRI) device that directly obtains magnetic resonance images.

Referring to FIG. 1, the computing device 100 may obtain a training dataset 50 for training a neural network model 10. More specifically, the computing device 100 may obtain a plurality of magnetic resonance images 30, obtained by a plurality of other electronic devices 200, or magnetic resonance signals 20 corresponding to the magnetic resonance images 30 from the plurality of other electronic devices 200 that obtain the magnetic resonance images 30, and may then obtain the training dataset 50.

For example, the magnetic resonance signals 20 may be k-space data, and the magnetic resonance images 30 may be two-dimensional or three-dimensional images obtained through inverse Fourier operations for the magnetic resonance signals 20. The computing device 100 may obtain the pulse sequence data, obtained by the plurality of other electronic devices 200, from the plurality of other electronic devices 200. In this case, the pulse sequence data may include the k-space data collected based on specific pulse sequences used in the other electronic devices 200. The pulse sequence data may include the two-dimensional pulse sequence data collected in a two-dimensional space or the three-dimensional pulse sequence data collected in a three-dimensional space.

In this case, the magnetic resonance images 30 and the magnetic resonance signals 20 may be included and transmitted or received in DICOM (Digital Imaging and Communications in Medicine) data. DICOM refers to a medical digital imaging and communications standard, which is a general term for various standards used for digital image representation and communications in medical devices. DICOM data may mainly include patient information and media characteristics. For example, various types of medical information data included in DICOM data are patient-related text information and unprocessed media information collected at medical sites, and there are no special restrictions on their formats. More specifically, DICOM data may include biometric information of patients, image information about patients or treatment portions generated at medical sites (e.g., the magnetic resonance images 30), and information about devices that acquired the images.

Meanwhile, the computing device 100 may obtain a training dataset 50 based on the obtained magnetic resonance images 30 and/or magnetic resonance signals 20. More specifically, the computing device 100 may obtain training images 40 having a lower quality than the magnetic resonance images 30 by adjusting the quality of the magnetic resonance images 30 and/or magnetic resonance signals 20. The computing device 100 may degrade the quality of the magnetic resonance images 30 by adjusting at least one of a plurality of elements set in connection with the quality of the magnetic resonance images 30 and/or the magnetic resonance signals 20. In particular, the quality of the same magnetic resonance image 30 may be degraded in various manners by selectively combining the plurality of elements. This may be referred to as adjusting the quality of the magnetic resonance image 30 in a plurality of aspects or a plurality of dimensions. Accordingly, the computing device 100 may obtain a plurality of training images 40 for the same magnetic resonance image 30 by degrading the quality of the same magnetic resonance image 30 in various manners.

Meanwhile, the computing device 100 may train the neural network model 10 based on the obtained training dataset 50 and context data corresponding to training data included in the training dataset 50. In this case, the context data may be data that describes the relationship between the magnetic resonance images 30 constituting training data and the training images 40 and the background of the deterioration in the quality of the magnetic resonance images 30. Through this, the computing device 100 enables the neural network model 10 to accurately learn the relationships between the variously obtained training images 40 and the magnetic resonance images 30 corresponding to the training images 40.

Embodiments of the present disclosure will be described in detail with reference to FIGS. 2 to 8 below.

Figure 2:
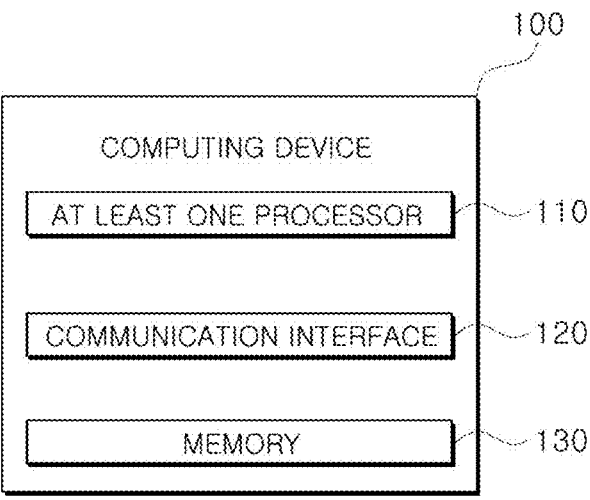
FIG. 2 is a block diagram of a computing device for obtaining magnetic resonance images based on a deep learning model according to one embodiment of the present disclosure.
Figure 3:
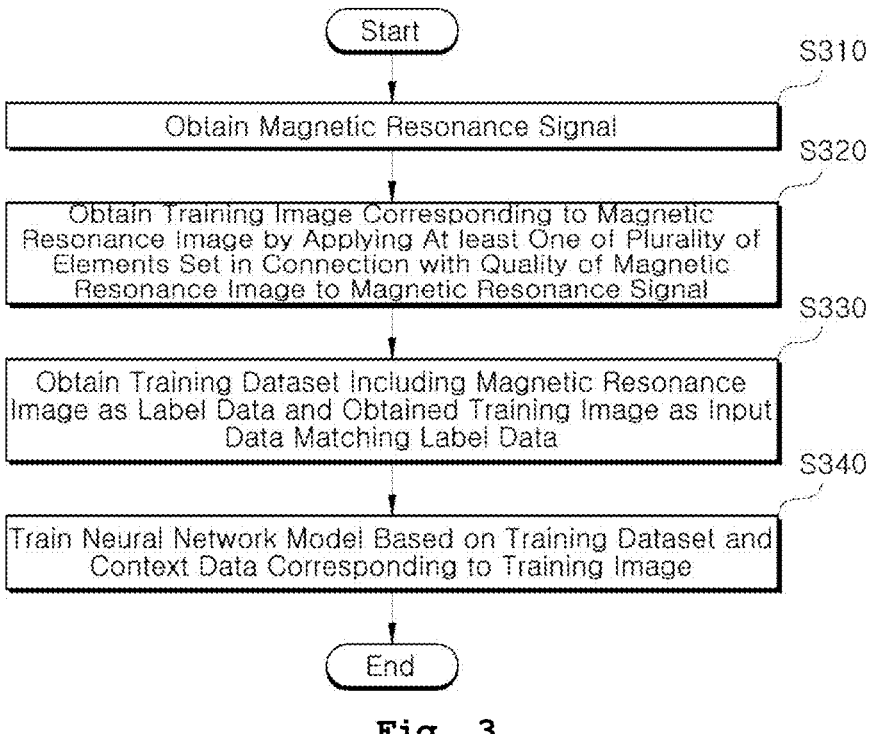
FIG. 3 is a flowchart of a method of controlling a computing device for obtaining magnetic resonance images based on a deep learning model according to one embodiment of the present disclosure.

FIG. 2 is a block diagram of a computing device 100 for obtaining magnetic resonance images 30 based on a deep learning model according to one embodiment of the present disclosure. FIG. 3 is a flowchart of a method of controlling a computing device 100 for obtaining magnetic resonance images 30 based on a deep learning model according to one embodiment of the present disclosure.

Referring to FIG. 2, the computing device 100 according to one embodiment of the present disclosure may include at least one processor 110 (hereinafter the processor), a communication interface 120, and memory 130. However, FIG. 2 shows only an example, and the computing device 100 may further include other components for implementing a computing environment. Furthermore, only some of the disclosed components may be included in the computing device 100.

The processor 110 according to an embodiment of the present disclosure may be understood as a constituent unit including hardware and/or software for performing computing operation. For example, the processor 110 may read a computer program and perform data processing for machine learning. The processor 110 may process computational processes such as the processing of input data for machine learning, the extraction of features for machine learning, and the calculation of errors based on backpropagation. The processor 110 for performing such data processing may include a central processing unit (CPU), a general purpose graphics processing unit (GPGPU), a tensor processing unit (TPU), an application specific integrated circuit (ASIC), or a field programmable gate array (FPGA). Since the types of processor 110 described above are only examples, the type of processor 110 may be configured in various manners within a range understandable to those skilled in the art based on the content of the present disclosure.

The processor 110 is electrically connected to other components (i.e., the communication interface 120 and the memory 130) of the computing device 100 and controls the overall operation of the computing device 100.

The memory 130 according to an embodiment of the present disclosure may be understood as a constituent unit including hardware and/or software for storing and managing data that is processed in the computing device 100. That is, the memory 130 may store any type of data generated or determined by the processor 110 and any type of data received by the communication interface 120. For example, the memory 130 may include at least one type of storage medium of a flash memory type, hard disk type, multimedia card micro type, and card type memory, random access memory (RAM), static random access memory (SRAM), read-only memory (ROM), electrically erasable programmable read-only memory (EEPROM), programmable read-only memory (PROM), magnetic memory, a magnetic disk, and an optical disk. Furthermore, the memory 130 may include a database system that controls and manages data in a predetermined system. Since the types of memory 130 described above are only examples, the type of memory 130 may be configured in various manners within a range understandable to those skilled in the art based on the content of the present disclosure.

The memory 130 may structure, organize, and manage data required for the processor 110 to perform operations, combinations of data, and program codes executable by the processor 110. For example, the memory 130 may store a neural network model 10, a training dataset 50, and context data. Furthermore, the memory 130 may store program codes that operate to train the neural network model 10 based on the training dataset 50 and the context data, program codes that operate the neural network model 10 to receive magnetic resonance images 30 and perform inference according to the purpose of use of the computing device 100, and processed data generated as the program codes are executed.

The communication interface 120 according to an embodiment of the present disclosure may be understood as a constituent unit that transmits and receives data through any type of known wired/wireless communication system. For example, the communication interface 120 may perform data transmission and reception using a wired/wireless communication system such as a local area network (LAN), a wideband code division multiple access (WCDMA) network, a long term evolution (LTE) network, the wireless broadband Internet (WiBro), a 5th generation mobile communication (5G) network, a ultra wide-band wireless communication network, a ZigBee network, a radio frequency (RF) communication network, a wireless LAN, a wireless fidelity network, a near field communication (NFC) network, or a Bluetooth network. Since the above-described communication systems are only examples, the wired/wireless communication system for the data transmission and reception of the communication interface 120 may be applied in various manners other than the above-described examples.

The communication interface 120 may receive data necessary for the processor 110 to perform computation through wired/wireless communication with any system or client or the like. Furthermore, the communication interface 120 may transmit data generated through the computation of the processor 110 through wired/wireless communication with any system or client or the like. For example, the communication interface 120 may receive medical data through communication with a database within a hospital environment, a cloud server that performs tasks such as the standardization of medical data, or the computing device 100. The communication interface 120 may transmit output data of the neural network model 10, and intermediate data, processed data, etc. derived from the computational process of the processor 110 through communication with the above-described database, server, or computing device 100.

Referring to FIG. 3, according to one embodiment of the present disclosure, the processor 110 obtains magnetic resonance signals 20 in step S310. In this case, the magnetic resonance signals 20 may be obtained by the computing device 100 via magnetic fields generated for an object (e.g., a patient), or may be obtained from a plurality of other electronic devices 200 obtaining magnetic resonance images 30 via a communication interface 120. For example, the computing device 100 may obtain pulse sequence data, obtained by the plurality of other electronic devices 200, from the plurality of other electronic devices 200 as the magnetic resonance signals 20. In this case, the pulse sequence data may include the k-space data collected based on the specific pulse sequences used in the other electronic devices 200. The pulse sequence data may include the two-dimensional pulse sequence data collected in a two-dimensional space or the three-dimensional pulse sequence data collected in a three-dimensional space.

Meanwhile, the processor 110 may obtain magnetic resonance signals 20 by receiving DICOM (Digital Imaging and Communications in Medicine) data from the other electronic devices 200. More specifically, the processor 110 may extract the magnetic resonance signals 20 included in the DICOM data, or may extract the magnetic resonance images 30 and then obtain the magnetic resonance signals 20 through discrete Fourier transformation. Since the description given in conjunction with FIG. 1 may be applied to this in the same manner, a detailed description thereof will be omitted.

In addition, the processor 110 may obtain training images 40 corresponding to the magnetic resonance images 30 by applying at least one of a plurality of elements set in connection with the quality of the magnetic resonance images 30 corresponding to the magnetic resonance signals 20 to the magnetic resonance signals 20 in step S320.

The plurality of elements are set in connection with the quality of the magnetic resonance images 30 corresponding to the magnetic resonance signals 20, and may be elements that affect and determine the quality of the magnetic resonance images 30. For example, the quality of the magnetic resonance images 30 may be evaluated based on the resolution of the magnetic resonance images 30 and the degree of noise included in the magnetic resonance images 30. In other words, the fact that the quality of the magnetic resonance images 30 is high may mean that the resolution of the magnetic resonance images 30 is high and the noise thereof is low. In this case, the plurality of elements may be elements that determine the resolution of the magnetic resonance images 30 and the degree of noise included in the magnetic resonance images 30. In particular, an element connected with the resolution of the magnetic resonance images 30 may be connected with the type of under-sampling method for the magnetic resonance signals 20. Under-sampling is a technique for obtaining a magnetic resonance image by scanning a target object but performing partial sampling instead of completely filling an overall k-space region with k-space data. Under-sampling may also be referred to as sub-sampling.

The processor 110 may apply at least one of the plurality of elements to the magnetic resonance images 30. That is, the processor 110 may degrade the quality of the magnetic resonance images 30 corresponding to the magnetic resonance images 30 by applying at least one of the plurality of elements set in connection with the quality of the magnetic resonance images 30 to the magnetic resonance signals 20. Furthermore, the processor 110 may obtain the degraded magnetic resonance images 30 as training images 40 used to train the neural network model 10.

Meanwhile, according to one embodiment of the present disclosure, the processor 110 may obtain training images 40 corresponding to the magnetic resonance images 30 by applying at least one of the plurality of elements to the magnetic resonance signals 20 in a k-space region. More specifically, the processor 110 may distort the magnetic resonance signals 20 in a k-space region and obtain the training images 40 based on the distorted magnetic resonance signals 20. As an example, the processor 110 may distort k-space data by applying at least one of a plurality of k-space data elements included in the magnetic resonance images 30 in a k-space region. The processor 110 may distort the k-space data by adding noise to the k-space data, or may distort the k-space data by applying an under-sampling pattern to the k-space data and thus selecting part of the k-space data.

Figure 4A:
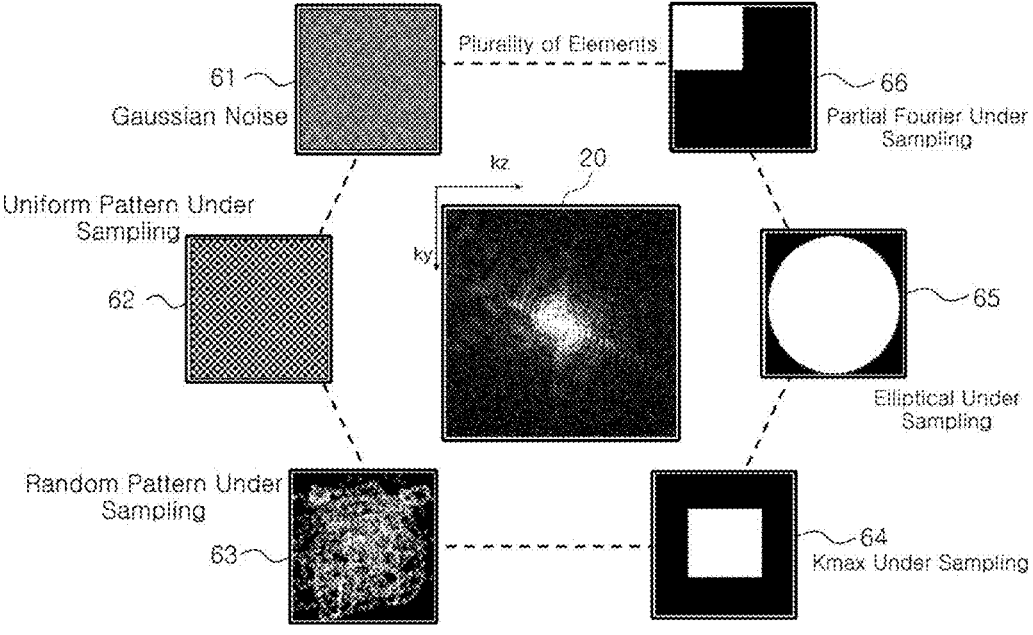
FIGS. 4a and 4b are diagrams illustrating a plurality of elements applied to magnetic resonance signals in a k-space region according to one embodiment of the present disclosure.
Figure 4B:
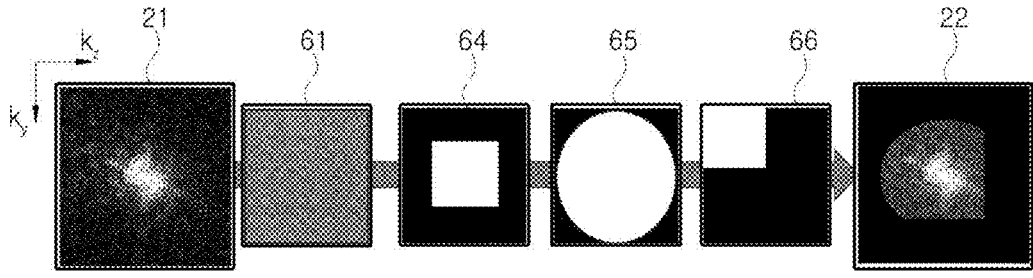

FIGS. 4a and 4b are diagrams illustrating a plurality of elements applied to a magnetic resonance signal 20 in a k-space region according to one embodiment of the present disclosure. FIG. 4a illustrates a plurality of elements applied to the magnetic resonance signal 20 on the plane of the axis of a phase encoding direction Ky and the axis of a slice encoding selection direction Kz excluding a frequency encoding direction Kx.

Referring to FIG. 4a, the plurality of elements may include at least any one of Gaussian noise 61, uniform pattern under-sampling 62, random pattern under-sampling 63, Kmax under-sampling 64, elliptical under-sampling 65, and partial Fourier under-sampling 66.

More specifically, applying Gaussian noise to the magnetic resonance signal 20 may be adding or subtracting Gaussian noise to or from k-space data. That is, the processor 110 may distort magnetic resonance signals by generating random noise (e.g., Gaussian noise) in a k-space region and subtracting it from k-space data. Alternatively, the processor 110 may distort magnetic resonance signals by subtracting random noise (i.e., Gaussian noise) present in k-space data.

The uniform pattern under-sampling 62 is a method of selecting k-space data at preset intervals in a k-space region, and may include uniform GRAPPA pattern under-sampling and uniform CAIPIRINHA pattern under-sampling. The random pattern under-sampling 63 may be a method of randomly selecting k-space data in a k-space region. Furthermore, the Kmax under-sampling 64 may be performed in all the encoding directions Kx, Ky, and Kz in such a manner as to selectively omit high-frequency k-space data at the edge of a k-space region. Furthermore, the elliptical under-sampling 65 may be a method of selecting k-space data included in the elliptical region of a k-space region and omitting the remaining k-space data, thereby maintaining low-frequency data in the center and also omitting high-frequency data at the edge. Meanwhile, the partial Fourier under-sampling 66 may be performed in all the encoding directions Kx, Ky, and Kz in such a manner as to select k-space data included in the partial region of a k-space region and omit the remaining k-space data. The processor 110 may distort magnetic resonance signals by applying various under-sampling methods as described above.

Meanwhile, when a first magnetic resonance signal 21 is distorted by adding Gaussian noise 61 to the first magnetic resonance signal 21 shown in FIG. 4b, applying the Kmax under-sampling 64 in all encoding directions, applying the elliptical under-sampling 65 and applying the partial Fourier under-sampling 66 in all the encoding directions, a second magnetic resonance signal 22 with part of k-space data missing may be obtained. Furthermore, based on the second magnetic resonance signal 22, the processor 110 may obtain a training image 40. However, the order in which the plurality of elements are applied, which is shown in FIG. 4b, is only an example for illustration of the present disclosure, and is not limited thereto.

Meanwhile, the processor 110 may obtain the training image 40 based on the distorted magnetic resonance signal 20. More specifically, the processor 110 may obtain the training image 40 corresponding to the distorted magnetic resonance signal 20 by performing an inverse Fourier operation on the distorted magnetic resonance signal 20 (i.e., k-space data). In this case, the processor 110 may obtain the training image 40 corresponding to the distorted magnetic resonance signal 20 based on a parallel imaging technique (e.g., Grappa) and another pre-trained neural network model.

Figure 5:
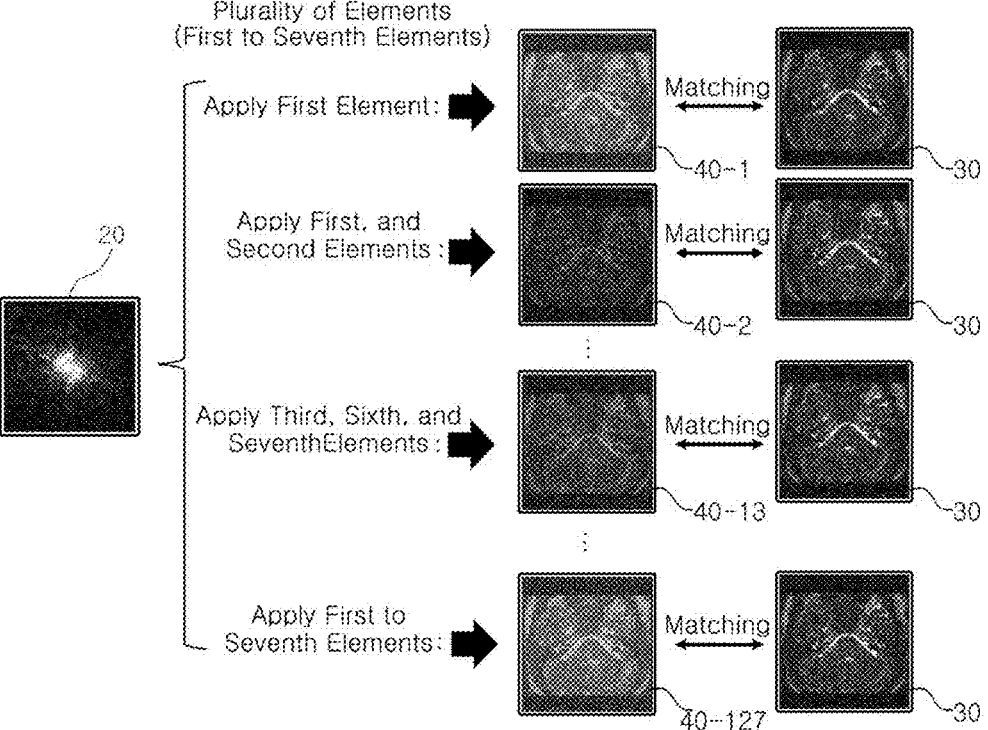
FIG. 5 is an exemplary diagram showing the obtainment of a plurality of training images corresponding to a magnetic resonance image according to one embodiment of the present disclosure.

FIG. 5 is an exemplary diagram showing the obtainment of a plurality of training images 40 corresponding to a magnetic resonance image 30 according to one embodiment of the present disclosure.

Meanwhile, the processor 110 may repeatedly distort a magnetic resonance signal 20 by varying the type and number of applied elements, and may obtain the plurality of training images 40 based on a plurality of differently distorted magnetic resonance signals 20. In this case, the plurality of training images 40 may have different qualities corresponding to the types, numbers, and degrees of distortion of applied elements.

The processor 110 may obtain the plurality of training images 40 corresponding to the same magnetic resonance image 30. More specifically, the processor 110 may repeatedly distort the magnetic resonance signal 20 by varying the type, number, and degree of distortion of elements applied to the magnetic resonance signal 20. Referring to FIG. 5, the processor 110 may obtain the plurality of training images 40 corresponding to the magnetic resonance image 30 by combining a plurality of elements (first to seventh elements). The processor 110 may obtain a first training image 40-1 by applying the first element to the magnetic resonance signal 20, may obtain a second training image 40-2 by applying the first and second elements to the magnetic resonance signal 20, may obtain a thirteenth training image 40-13 by applying the third, sixth, and seventh elements to the magnetic resonance signal 20, and may obtain a 127th training image 40-127 by applying the first to seventh elements to the magnetic resonance signal 20.

In this manner, the processor 110 may obtain various training images 40 by applying a plurality of elements (the first to seventh elements) to the magnetic resonance signal 20 individually or by applying selective combinations of at least two elements to the magnetic resonance signal 20. In this time, the plurality of training images 40 obtained for the same magnetic resonance image 30 may have different resolutions and noises depending on the type and number of elements applied to the magnetic resonance signal 20. That is, the processor 110 may obtain training data including various cases in which the quality of the same magnetic resonance image 30 is degraded by setting a plurality of elements connected with the quality of the magnetic resonance image 30 for the magnetic resonance signal 20 and applying various element combinations to the magnetic resonance signal 20. Furthermore, the processor 110 may train the neural network model 10 to restore the magnetic resonance image 30 more effectively by securing a plurality of pieces of training data whose quality is degraded in various manners for a plurality of magnetic resonance images.

Meanwhile, according to one embodiment of the present disclosure, when the number of training images 40 is smaller than a preset value, the processor 110 may additionally distort the magnetic resonance signal 20 by adjusting the frequency range of Kmax under-sampling, and may additionally acquire training images 40 based on the additionally distorted magnetic resonance signal 20.

That is, the processor 110 may determine whether the number of training images 40 is equal to or larger than a preset value in order to determine whether sufficient training images 40 are secured for the magnetic resonance image 30. Furthermore, when it is determined that the number of training images 40 is smaller than the preset value and the number of the plurality of training images 40 obtained for the same magnetic resonance image 30 is smaller than the preset number, the processor may additionally distort the magnetic resonance signal 20 by applying the different frequency range of the Kmax under-sampling out of the plurality of elements. For example, the processor 110 may change the frequency range from a first range to a second range that is wider than the first range. In this case, it is obvious that the processor 110 may apply another element, together with Kmax under-sampling having a changed frequency range to the magnetic resonance signal 20. The Kmax under-sampling is designed to omit high-frequency k-space data located at the edge of a k-space region, and the processor 110 may additionally distort the magnetic resonance signal 20 by adjusting the range of the omitted high-frequency k-space data and thus additionally obtain one or more training images 40.

In this case, the processor 110 may determine the similarity between the plurality of training images 40, may consider a plurality of training images 40 having a similarity higher than a preset value to be the same training images 40, and may determine the number of training images 40. Meanwhile, in the case of the plurality of training images 40 having a similarity higher than the preset value, the processor 110 may reduce the similarity by applying different elements to the magnetic resonance signal 20 or applying the different frequency ranges of Kmax under-sampling and re-obtain training images 40 corresponding to the respective cases. In particular, the processor 110 may determine the similarity after distorting the magnetic resonance signal via all combinations that can be assumed using a plurality of elements.

In addition, when the number of training images 40 is smaller than a preset number, the processor 110 may additionally distort the magnetic resonance signal 20 by changing the intensity of Gaussian noise, and may additionally obtain one or more training images 40 based on one or more additionally distorted magnetic resonance signals 20. More specifically, when it is determined that the number of training images 40 is smaller than the preset value, the processor 110 may additionally distort the magnetic resonance signal 20 by changing the intensity of Gaussian noise applied to the same magnetic resonance image 30, and may additionally obtain one or more training images 40 based on one or more additionally distorted magnetic resonance signals 20. For example, the processor 110 may additionally obtain a distorted magnetic resonance signal 20 by changing the intensity of Gaussian noise from a first intensity to a second intensity and applying it to the magnetic resonance signal 20.

In addition, when the number of training images 40 is smaller than the preset value, the processor 110 may additionally distort the magnetic resonance signal 20 by correcting the under-sampling multiple, and may additionally obtain one or more training images 40 based on one or more additionally distorted magnetic resonance signal 20. More specifically, the processor 110 may additionally distort the magnetic resonance signal 20 by adjusting at least one of the uniform pattern under-sampling multiple, the random pattern under-sampling multiple, the Kmax under-sampling multiple, the elliptical under-sampling multiple, and the partial Fourier under-sampling multiple, and may additionally obtain one or more training images 40 based on one or more additionally distorted magnetic resonance signals 20. For example, the processor 110 may obtain an additionally distorted magnetic resonance signal 20 by changing the uniform pattern under-sampling multiple from a first value to a second value and applying it to the magnetic resonance signal 20. Through this, the processor 110 may improve the performance of the neural network model 10 by securing more diverse training images 40 and training the neural network model 10 with them.

According to one embodiment of the present disclosure, the processor 110 obtains a training dataset 50 that includes the magnetic resonance image 30 as label data and includes the obtained training images 40 as the input data that matches the label data in step S330. In this case, the processor 110 may obtain a plurality of training datasets 50 by matching a plurality of different input data (the training images 40) to the same label data (the magnetic resonance image 30).

Meanwhile, according to one embodiment of the present disclosure, the processor 110 may set a plurality of restoration scenarios for the magnetic resonance image 30 according to the type, number, and degree of distortion of elements applied to the magnetic resonance signal 20, may classify a plurality of training image 40 for the plurality of set restoration scenarios, and may obtain a sub-training dataset 50 corresponding to each of the restoration scenarios.

More specifically, the processor 110 may obtain a plurality of training images 40 corresponding to a plurality of magnetic resonance images 30, respectively, by distorting a plurality of magnetic resonance signals 20 corresponding to the plurality of magnetic resonance images 30, respectively. In this case, the processor 110 may set up a plurality of restoration scenarios for the magnetic resonance images 30 according to the type, number, and degree of distortion of elements applied to obtain the plurality of training images 40. In this case, each of the restoration scenarios may be the information that describes a process of restoring the quality of a corresponding training image 40 by backtracking a magnetic resonance image 30 from the training image 40.

In addition, the processor 110 may classify the plurality of training images 40 included in the training dataset 50 and the plurality of magnetic resonance images 30 matching the plurality of training images 40 into individual restoration scenarios, and may identify the number of sub-training datasets 50 corresponding to each of the restoration scenarios. Furthermore, the processor 110 may additionally secure one or more corresponding sub-training datasets for the restoration scenario in which the number of sub-training datasets is smaller than a preset value. That is, the processor may additionally securing a sub-training dataset by additionally receiving a magnetic resonance signal 20 from another electronic device 200 via the communication interface 120 and applying at least one element corresponding to a corresponding restoration scenario to the additionally received magnetic resonance signal 20.

According to one embodiment of the present disclosure, the processor 110 may perform the standardization of a training dataset 50 including at least one of the sizes, directions, pixel spacing, and scale adjustment of pixel values of the magnetic resonance images 30 and the training images 40. The standardization may also be performed via a standardization module connected to the input terminal of the neural network model 10.

The processor 110 may perform a task for the standardization of the magnetic resonance images 30 and training images 40 included in the training dataset 50 prior to the training of the neural network model 10. In this case, the standardization is performed to match the sizes, directions, and/or the like of the plurality of magnetic resonance images 30 and the plurality of training images 40, and may be performed to effectively train the neural network model 10 and further increase the training effect of the neural network model 10.

For example, the processor 110 may adjust the directions of the plurality of magnetic resonance images 30 and the plurality of training images 40 to match each other. More specifically, the processor 110 may match the directions of the plurality of magnetic resonance images 30 and the plurality of training images 40 so that the row direction (or the vertical direction) matches the phase encoding direction and the column direction (or the horizontal direction) matches the frequency encoding direction. Furthermore, the processor 110 may match the shapes and sizes of the plurality of magnetic resonance images 30 and the plurality of training images 40 by cropping the zero padding areas of the plurality of magnetic resonance images 30 and the plurality of training images 40 in order to adjust the asymmetrically displayed field of views (FOVs) of the plurality of magnetic resonance images 30 and the plurality of training images 40. As an example, the shapes of the plurality of magnetic resonance images 30 and the plurality of training images 40 may be matched to be rectangular in shape. Furthermore, the processor 110 may match the sizes of the plurality of magnetic resonance images 30 and the plurality of training images 40 by adjusting them. More specifically, the processor 110 may keep the image pixel spacing constant by adjusting the column size to 1024 when the plurality of magnetic resonance images 30 and the plurality of training images 40 are two-dimensional images (or when the magnetic resonance signal 20 is two-dimensional sequence data) or by adjusting the column size to 768 in the case of a three-dimensional pulse sequence when the plurality of magnetic resonance images 30 and the plurality of training images 40 are three-dimensional images (or when the magnetic resonance signal 20 is three-dimensional sequence data), based on the Lanczos method. Furthermore, the processor 110 may perform a task for the normalization of the plurality of magnetic resonance images 30 and the plurality of training images 40. More specifically, the processor 110 may adjust the pixel values so that the ranges of the pixel values of the plurality of magnetic resonance images 30 and the plurality of training images 40 match each other.

The above-described standardization task may be performed sequentially, or may be selectively performed according to the plurality of magnetic resonance images 30 and the plurality of training images 40. In particular, the processor 110 may selectively perform the standardization task by determining the device information that obtained each of the magnetic resonance signals 20 (or each of the magnetic resonance images 30) or by identifying the size, direction, shape, and/or the like of the magnetic resonance signal 20 (or the magnetic resonance image 30), based on DICOM data including the magnetic resonance signal 20 (or the magnetic resonance image 30).

Figure 6:
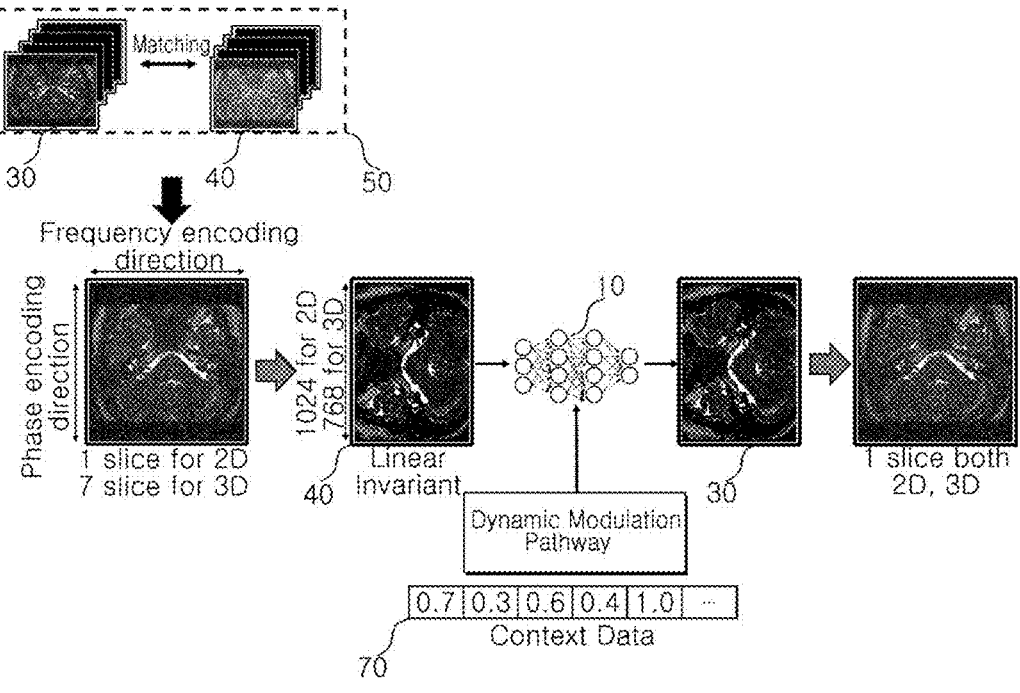
FIG. 6 is an exemplary diagram schematically showing the structure of a neural network model according to one embodiment of the present disclosure.

FIG. 6 is an exemplary diagram schematically showing the structure of a neural network model 10 according to one embodiment of the present disclosure.

According to one embodiment of the present disclosure, the processor 110 may train the neural network model 10 based on the training dataset 50 and context data 70 corresponding to the training images 40 in step S540. The processor 110 may train the neural network model 10 by utilizing the context data 70 as auxiliary input together with the training dataset 50. As an example, the neural network model 10 is a neural network model 10 having a U-Net framework, and the neural network model 10 may include a network model such as a deep neural network (DNN), a recurrent neural network (RNN), a bidirectional recurrent deep neural network (BRDNN), a multilayer perceptron (MLP), or a convolutional neural network (CNN).

The context data 70 corresponds to the distorted magnetic resonance signals 20, and thus, may correspond to the training images 40. In this case, the context data 70 may be the data that describes the relationship between the magnetic resonance images 30 and training images 40, constituting training data, and the background of the degradation in the quality of the magnetic resonance images 30. Meanwhile, the context data 70 together with the training images 40 that correspond to the context data 70 may be included in the training dataset 50.

According to one embodiment of the present disclosure, the neural network model 10 may include a dynamic modulation pathway (DMP) that is connected to the intermediate layer of the plurality of layers constituting the neural network model 10 and extracts feature information of the context data 70 when the context data 70 is input. That is, the context data 70 may be input to the intermediate layer of the neural network model 10 via the dynamic modulation pathway (DMP) 12. In order to extract feature information of the context data 70, the dynamic modulation pathway (DMP) 12 may include a fully connected layer and an activation function (e.g., a Relu function). Meanwhile, the feature information of the extracted context may be integrated into the U-Net framework and function as a convolution kernel.

According to one embodiment of the present disclosure, the processor 110 may identify scan parameters corresponding to the distorted magnetic resonance signals 20 in the k-space region, and may identify the identified scan parameters as the context data 70 corresponding to the training images 40. In particular, the processor 110 may identify the context data 70 based on at least one element applied to distort the magnetic resonance signal 20. The processor 110 may identify the value of a scan parameter, changed as the magnetic resonance signal 20 is distorted (or as at least one element is applied), out of the scan parameters corresponding to the magnetic resonance signals 20, and may identify the context data 70 with the value of the identified scan parameter.

In addition, according to one embodiment of the present disclosure, the processor 110 may identify the amount of variation of noise by comparing the noise of the magnetic resonance signal 20 and the noise of the distorted magnetic resonance signal 20 in the k-space region, and may identify the identified amount of variation of noise as the context data 70 corresponding to the training image 40. In this case, the processor 110 may determine the amount of variation of noise based on the amount of Gaussian noise added to the k-space data in connection with the addition of Gaussian noise out of the plurality of elements.

Meanwhile, referring to FIG. 6, the context data 70 may be input to the dynamic modulation path (DMP) 12 in the form of a one-dimensional matrix. In this case, the context data 70 may be converted into a one-dimensional matrix corresponding to the above-described scan parameters or a one-dimensional matrix corresponding to the amounts of variation of noise and then input to the dynamic modulation path (DMP). In particular, it may be a one-dimensional matrix in which the scan parameters and the amounts of variation of noise are combined together.

Meanwhile, according to one embodiment of the present disclosure, based on the plurality of training images 40 whose quality has been degraded in various manners for the plurality of magnetic resonance images 30, the processor 110 may train the neural network model 10 to restore the degraded qualities in various manners for the same magnetic resonance images 30. There may be obtained the neural network model 10 that has higher restoration capability and a higher effect than a conventional neural network model trained with only training data degraded due to the application of only a single element (e.g., uniform under-sampling).

Meanwhile, according to one embodiment of the present disclosure, the processor 110 may train the neural network model 10 by inputting the set restoration scenario information corresponding to the type, number, and degree of distortion of elements applied to the magnetic resonance signal 20 together with the training dataset 50 and the context data 70. Accordingly, the neural network model 10 may be trained to restore the magnetic resonance images 30 and, at the same time, output a restoration scenario relevant to a corresponding restoration process.

Figure 7:
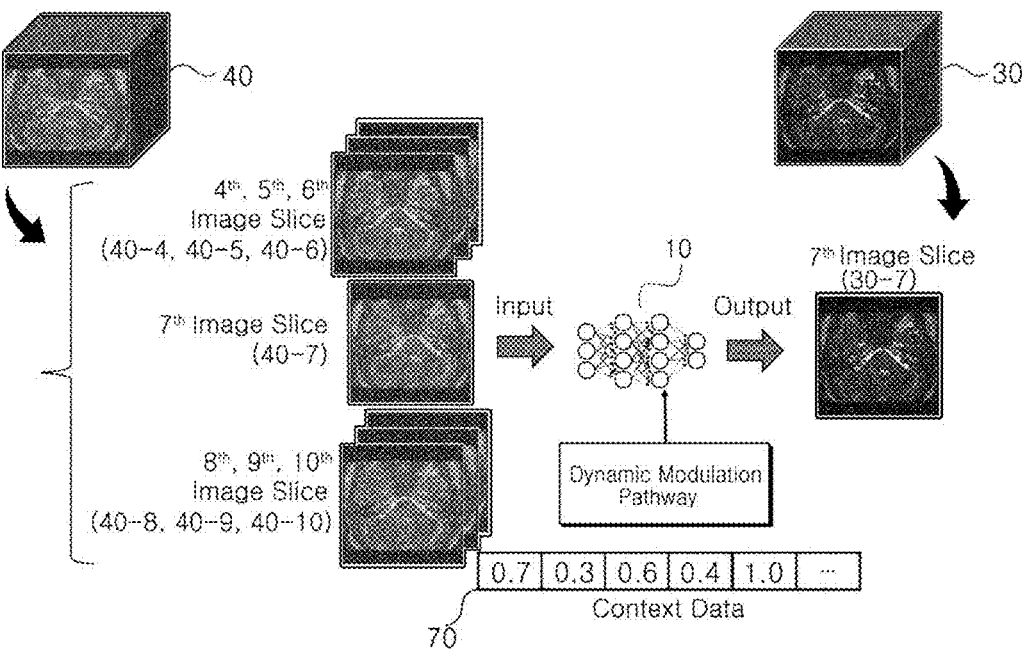
FIG. 7 is an exemplary diagram showing a method of training a neural network model to obtain a three-dimensional magnetic resonance image according to one embodiment of the present disclosure.

FIG. 7 is an exemplary diagram showing a method of training a neural network model 10 to obtain a three-dimensional magnetic resonance image 30 according to one embodiment of the present disclosure.

According to one embodiment of the present disclosure, when the magnetic resonance image 30 is three-dimensional data, the processor 110 may set a target image slice (hereinafter the first image slice), out of a plurality of image slices included in a training image 40, as target input data (hereinafter the first input data). Furthermore, the processor 110 may identify a plurality of image slices (hereinafter the second image slices) adjacent to the first slice, out of the plurality of image slices included in the training image 40, as a plurality of pieces of reference input data (hereinafter the second input data), and may set an image slice (hereinafter the third image slice) corresponding to the first slice, out of the plurality of image slices included in the magnetic resonance image 30, as label data. Furthermore, the processor 110 may set the first input data, the plurality of pieces of second input data, and the label data as a training dataset 50. In this case, the first input data and the plurality of pieces of second input data may be obtained by applying the same element out of a plurality of elements.

More specifically, when the magnetic resonance image 30 is three-dimensional data, the processor 110 may distort a magnetic resonance signal 20 corresponding to the magnetic resonance image 30 by applying at least one of a plurality of elements in a three-dimensional k-space region, and may obtain a training image 40, which is three-dimensional data corresponding to the magnetic resonance image 30, based on the distorted magnetic resonance signal 20. In this case, the processor 110 may set a training dataset 50 for each of the image slices constituting the training image 40 and then train the neural network model 10. In this case, the processor 110 may set each image slice and a plurality of other adjacent image slices as a dataset together.

For example, referring to FIG. 7, when the processor 110 sets a seventh image slice 40-7, out of the plurality of image slices that are sequentially stacked and constitute the three-dimensional training image 40, as first input data, the processor 110 may set six image slices adjacent to each other in the lateral direction (specifically, fourth, fifth, and sixth image slices 40-4, 40-5, and 40-6 and eighth, ninth, and tenth image slices 40-8, 40-9, and 40-10) as a plurality of pieces of second input data. Furthermore, the processor 110 may set a third image slice (i.e., a seventh image slice 30-7)

corresponding to the first image slice, out of the plurality of image slices that are sequentially stacked and constitute the three-dimensional magnetic resonance image 30, as label data. Furthermore, the processor 110 may set the first input data, the plurality of pieces of second input data, and the context data 70 as a training dataset 50. In the process of distorting the three-dimensional k-space data, for example, when Kmax under-sampling is performed on the magnetic resonance signal 20 in the slice encoding direction, sinc blurring may occur in each image slice in the slice encoding direction. This causes a problem in which a specific region of each image slice is blurred or the information of each image slice is lost toward its surrounding slices. In order to overcome this problem, the processor 110 may input each image slice and a plurality of other adjacent image slices to the neural network model 10 together, thereby training the neural network model 10 to obtain the information of each image slice from the plurality of other adjacent image slices and effectively restore the quality of the first image slice based on this information.

Meanwhile, according to one embodiment of the present disclosure, the neural network model 10 may include a plurality of neural network models 10 that restore the quality of a two-dimensional magnetic resonance image 30 and the quality of a three-dimensional magnetic resonance image 30. More specifically, the neural network model 10 may include a first neural network model 10 trained with training images 40 obtained by distorting a two-dimensional magnetic resonance signal 20 and a second neural network model 10 trained with a plurality of image slices that constitute training images 40 obtained by distorting a three-dimensional magnetic resonance signal 20. In this case, the second neural network model 10 may be trained based on each image slice and a plurality of other adjacent image slices, as described above. That is, the processor 110 may classify obtained magnetic resonance signals 20 (or magnetic resonance images 30) depending on whether the type thereof is two-dimensional or three-dimensional, and may use the classified signals 20 (or images 30) to train the plurality of neural network models 10.

Meanwhile, according to one embodiment of the present disclosure, when the training of the neural network model 10 is completed, the processor 110 may restore the quality of the magnetic resonance image by using the neural network model 10 trained according to the embodiment of the present disclosure described above.

In connection with this, the processor 110 may obtain a magnetic resonance image based on an accelerated imaging method. To this end, the magnetic resonance image may be obtained based on a magnetic resonance signal, to which at least one of a plurality of elements connected with the quality of the resonance image is applied, by an under-sampling method. More specifically, the processor 110 may obtain a magnetic resonance image by obtaining only part of k-space data by using an under-sampling method through accelerated imaging and performing an inverse Fourier operation on the obtained part of k-space data. As an example, elements connected with the quality of the magnetic resonance image may include a uniform under-sampling method, a random under-sampling method, a Kmax under-sampling method, an elliptical under-sampling method, and a partial Fourier under-sampling method connected with the under-sampling method, and may include the application of Gaussian noise. More specifically, in the process of obtaining a magnetic resonance signal by applying an under-sampling method, a distorted magnetic resonance signal in which part of a magnetic resonance signal is omitted may be obtained as the above-described various under-sampling methods are applied. Furthermore, the magnetic resonance image may be obtained based on a magnetic resonance signal to which noise is added (or from which noise is subtracted) according to the adjustment of a scan parameter for accelerated imaging.

In addition, the magnetic resonance image may be obtained by performing an inverse Fourier operation on a distorted magnetic resonance signal. In this case, the magnetic resonance image may have a relatively lower quality than a magnetic resonance image obtained by an over-sampling method.

In addition, the processor 110 may restore the quality of an obtained magnetic resonance image 30 by inputting the obtained magnetic resonance image 30 and context data 70 corresponding to the obtained magnetic resonance image 30 to the trained neural network model 10 according to the embodiment of the present disclosure described above. In this case, the context data 70 may be a scan parameter applied in the under-sampling process, or may be a noise reduction value in the magnetic resonance image 30 input by the user. The processor 110 may input the context data 70 via the dynamic modulation path (DMP) 12 of the previously trained neural network model 10. Furthermore, the processor 110 may obtain a magnetic resonance image 30 having an improved quality as the output of the previously trained neural network model 10.

The processor 110 may perform the standardization of the obtained magnetic resonance image 30 before inputting the magnetic resonance image 30 to the pre-trained neural network model. As an example, the processor 110 may adjust the direction of the magnetic resonance image 30 so that the row direction (or the vertical direction) of the magnetic resonance image 30 matches the phase encoding direction and the column direction (or the horizontal direction) matches the frequency encoding direction. Furthermore, the processor 110 may match the shape and size of the magnetic resonance image 30 by cropping the zero padding area of the magnetic resonance image 30 in order to adjust the asymmetrically displayed field of view (FOV) of the magnetic resonance image 30. Furthermore, the processor 110 may keep the image pixel spacing constant by adjusting the column size to 1024 when the magnetic resonance image 30 is a two-dimensional image (or when the magnetic resonance signal 20 is two-dimensional sequence data) or by adjusting the column size to 768 when the magnetic resonance image 30 is a three-dimensional image (or when the magnetic resonance signal 20 is three-dimensional sequence data), based on the Lanczos method. Furthermore, the processor 110 may perform a task for the normalization of the pixel values of the magnetic resonance image 30. Meanwhile, the standardization may be selectively performed based on information about a device that obtained the magnetic resonance signal 20 (or the magnetic resonance image 30) included in DICOM data corresponding to the magnetic resonance image 30 and the size, direction, shape, and/or the like of the magnetic resonance signal 20 (or the magnetic resonance image 30).

Meanwhile, the processor 110 may re-adjust, i.e., perform a reverse standardization task on, the improved (or restored) magnetic resonance image 30, obtained from the pre-trained neural network model 10, in accordance with the device information identified from the DICOM data.

According to one embodiment of the present disclosure, the processor 110 may input the magnetic resonance image 30 to a distinguishable one of the first and second neural network models 10 according to the type (a two-dimensional type or a three-dimensional type) of the magnetic resonance image 30.

Meanwhile, according to one embodiment of the present disclosure, the processor 110 may obtain information about a restoration scenario for the input magnetic resonance image 30 from the neural network model 10, and may provide it to a user. To this end, the neural network model 30 may be trained to identify a restoration scenario corresponding to an element by determining the type, number, and degree of distortion of at least one element applied to the input magnetic resonance image 30 or identifying the type, number, and degree of distortion of at least one element adjusted to restore the magnetic resonance image 30, and to output the restoration scenario corresponding to the element. Meanwhile, the processor 110 may prompt the user to adjust a scan parameter by providing the restoration scenario information.

Figure 8:
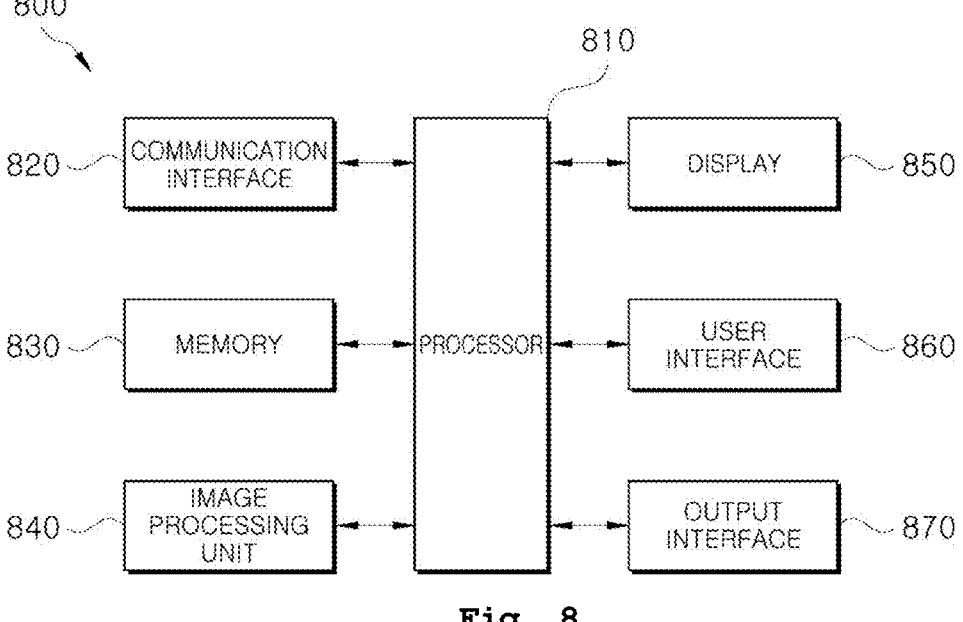
FIG. 8 is a detailed block diagram of a computing device for obtaining magnetic resonance images based on a deep learning model according to another embodiment of the present disclosure.

FIG. 8 is a detailed block diagram of a computing device 800 for obtaining magnetic resonance images 30 based on a deep learning model according to another embodiment of the present disclosure. For example, the computing device 800 may include at least one processor 810, a communication interface 820, memory 830, an image processing unit 840, a display 850, a user interface 860, and an output interface 870. The computing device shown in FIG. 8 may be the same device as the computing device 100 shown in FIG. 2. Accordingly, detailed descriptions of the components (the at least one processor 810, the communication interface 820, and the memory 830) that are the same the components shown in FIG. 2 will be omitted.

The image processing unit 840 may obtain a magnetic resonance image 30 corresponding to a magnetic resonance signal 20 by performing image processing (e.g., an inverse Fourier operation, or the like) on the magnetic resonance signal 20 obtained through a scanning unit or the magnetic resonance signal 20 obtained via the communication interface. Alternatively, the image processing unit 840 may restore the quality of the obtained magnetic resonance image 30 using a pre-trained neural network model.

The display 850 may display various images 850. In this case, the images include both still images and moving images. In particular, the display 850 may display obtained or restored magnetic resonance images 30, and may also provide information (e.g., restoration scenario information or the like) connected with the magnetic resonance images 30 to a user or object. The display 850 may be implemented as various forms of displays 850 such as a liquid crystal display (LCD) panel, an organic light emitting diode (OLED) display, a liquid crystal on silicon (LCoS) display, and a digital light processing (DLP) display. Furthermore, the display 850 may also include a drive circuit, a backlight unit, etc. that can be implemented in forms such as a-si TFTs, low temperature poly silicon (LTPS) TFTs, organic TFTs (OTFTs), and/or the like.

Meanwhile, the display 850 may be implemented as a touch screen by combining with a touch panel. In this case, the display 850 may perform the function of an input interface that receives a user's touch input as well as the function of an output interface that outputs images via a touch screen.

The user interface 860 may receive control commands for the overall operation of the computing device 100 from the user. For example, the user interface 860 may receive information about an object, a parameter, scan conditions, pulse sequences, and the like from the user, and in particular, may receive context data 70. For this purpose, the user interface 860 may be implemented as a keyboard, a mouse, a microphone, and/or the like.

The output interface 870 may output information, obtained by the computing device 100, to the outside. For this purpose, the output interface 870 may be implemented as a speaker, and/or the like. The speaker may output a voice message connected with a restoration scenario for the magnetic resonance image 30.

Meanwhile, according to one embodiment of the present disclosure, the computing device 100 may obtain a magnetic resonance image by directly scanning an object (e.g., a patient). To this end, the computing device 100 may further include a scanning unit, and the scanning unit may include a static magnetic field unit, a gradient magnetic field unit, and an RF coil unit.

The scanning unit may be implemented in a form in which an object (e.g., a patient) can be inserted into an empty internal space of the scanning unit. For this purpose, the scanning unit may further include a table. The scanning unit may form a static magnetic field and a gradient magnetic field in the internal space, and may radiate an RF signal. More specifically, the static magnetic field unit may form a static magnetic field to align the directions of the magnetic dipole moments of the atomic nuclei included in an object in the direction of the static magnetic field. For this purpose, the static magnetic field unit may be implemented as a permanent magnet or as a superconducting magnet using a cooling coil.

The gradient magnetic field unit may form a gradient magnetic field by applying a gradient to a static magnetic field in response to a control signal of the processor. The gradient magnetic field unit includes X, Y, and Z coils that form gradient magnetic fields in the X-axis, Y-axis, and Z-axis directions that are orthogonal to each other, and generates a gradient signal according to an imaging position so that a different resonance frequency can be induced for each part of an object.

The RF coil unit may radiate an RF signal (e.g., an RF pulse sequence) to an object in response to a control signal of a processor. Furthermore, the RF coil unit may receive a magnetic resonance signal (an MR signal) 20 emitted from the object. The RF coil unit may transmit an RF signal having the same frequency as the precession toward atomic nuclei undergoing precession on an object, may stop the transmission of an RF signal, and may receive a magnetic resonance signal 20 emitted from the object.

The RF coil section may be implemented as a transmission RF coil configured to generate electromagnetic waves having a radio frequency corresponding to the type of atomic nuclei and a reception RF coil configured to receive electromagnetic waves radiated from the atomic nuclei, or may be implemented as a single RF transmission and reception coil having both transmission and reception functions.

The various embodiments of the present disclosure described above may be combined with one or more additional embodiments, and may be changed within the range understandable to those skilled in the art in light of the above detailed description. The embodiments of the present disclosure should be understood as illustrative but not restrictive in all respects. For example, individual components described as unitary may be implemented in a distributed manner, and similarly, the components described as distributed may also be implemented in a combined form. Accordingly, all changes or modifications derived from the meanings and scopes of the claims of the present disclosure and their equivalents should be construed as being included in the scope of the present disclosure.

DESCRIPTION OF REFERENCE SYMBOLS

100: computing device
110: processor
120: communication interface
130: memory

The invention claimed is:

1. A method of obtaining magnetic resonance images based on deep learning, the method being performed by a computing device including at least one processor, the method comprising:

obtaining a training image corresponding to each magnetic resonance image by applying at least one of a plurality of elements set in connection with quality of the magnetic resonance image to a magnetic resonance signal corresponding to the magnetic resonance image;

obtaining a training dataset including the magnetic resonance image as label data and the obtained training image as input data matching the label data; and training a neural network model based on the training dataset and context data corresponding to the training image;

wherein obtaining the training image comprises distorting the magnetic resonance signal by applying the at least one of the plurality of elements set and obtaining the training image based on the distorted magnetic resonance signal.

2. The method of claim 1, wherein:

obtaining the training image comprises repeatedly distorting the magnetic resonance signal by varying at least one of types and numbers of applied elements and obtaining a plurality of training images based on a plurality of differently distorted magnetic resonance signals; and the plurality of training images have different qualities corresponding to the at least one of the types and numbers of applied elements.

3. The method of claim 2, wherein the plurality of elements comprise at least two of addition of Gaussian noise, uniform pattern under-sampling, random pattern under-sampling, Kmax under-sampling, elliptical under-sampling, and partial Fourier under-sampling.

4. The method of claim 3, further comprising, when a number of the plurality of training images is smaller than a preset value, additionally distorting the magnetic resonance signal by adjusting a maximum frequency range of the Kmax under-sampling and additionally obtaining one or more training images based on the additionally distorted magnetic resonance signal.

5. The method of claim 3, further comprising, when a number of the plurality of training images is smaller than a preset value, additionally distorting the magnetic resonance signal by adjusting a sampling multiple of at least one of the uniform pattern under-sampling, the random pattern under-sampling, the Kmax under-sampling, the elliptical under-sampling, and the partial Fourier under-sampling, and additionally obtaining one or more training images based on the additionally distorted magnetic resonance signal.

6. The method of claim 3, further comprising, when a number of the plurality of training images is smaller than a preset value, adjusting an intensity of the Gaussian noise, additionally distorting the magnetic resonance signal by adding the adjusted Gaussian noise, and additionally obtaining one or more training images based on the additionally distorted magnetic resonance signal.

7. The method of claim 1, wherein the neural network model comprises a dynamic modulation pathway that is connected to an intermediate one of a plurality of layers constituting the neural network model and extracts feature information of the context data when the context data is input.

8. The method of claim 2, further comprising identifying a scan parameter corresponding to the distorted magnetic resonance signal and identifying the identified scan parameter as the context data corresponding to the training image.

9. The method of claim 1, further comprising identifying an amount of variation of noise by comparing noise of the magnetic resonance signal and noise of the distorted magnetic resonance signal with each other and identifying the identified amount of variation of noise as the context data corresponding to the training image.

10. The method of claim 1, wherein obtaining the training dataset comprises:

when the magnetic resonance image is three-dimensional data, setting a first one of a plurality of image slices, included in the training image, as first input data;

setting at least one slice adjacent to the first slice, out of the plurality of image slices included in the training image, as a second input data;

setting a third slice corresponding to the first slice, out of a plurality of image slices included in the magnetic resonance image, as label data; and setting the first input data, the second input data, and the label data as the training dataset.

11. The method of claim 1, further comprising performing standardization including at least one of sizes, directions, pixel spacing, and scale adjustment of pixel values of the magnetic resonance image and the training image for the training dataset.

12. The method of claim 2, further comprising setting a plurality of restoration scenarios for the magnetic resonance image according to at least one of the types and numbers of elements applied to the magnetic resonance signal, classifying the plurality of training images for the individual plurality of set scenarios, and obtaining a sub-training dataset corresponding to each of the scenarios.

13. A computing device for obtaining magnetic resonance images based on deep learning, the computing device comprising:

memory configured to store a neural network model; and at least one processor configured to obtain a training image corresponding to each magnetic resonance image by applying at least one of a plurality of elements set in connection with quality of the magnetic resonance image to a magnetic resonance signal corresponding to the magnetic resonance image, to obtain a training dataset including the magnetic resonance image as label data and the obtained training image as input data matching the label data, and to train the neural network model based on the training dataset and context data corresponding to the training image;

wherein the at least one processor is further configured to distort the magnetic resonance signal by applying the at least one of the plurality of elements set and obtain the training image based on the distorted magnetic resonance signal.

* * * * *